US008471456B2

(12) United States Patent
Bechtel et al.

(10) Patent No.: US 8,471,456 B2
(45) Date of Patent: Jun. 25, 2013

(54) ELECTROLUMINESCENT LIGHT SOURCE WITH IMPROVED COLOR RENDERING

(75) Inventors: Hans-Helmut Bechtel, Roetgen (DE); Wolfgang Busselt, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 513 days.

(21) Appl. No.: 11/576,901

(22) PCT Filed: Sep. 29, 2005

(86) PCT No.: PCT/IB2005/053213
§ 371 (c)(1), (2), (4) Date: Apr. 9, 2007

(87) PCT Pub. No.: WO2006/040704
PCT Pub. Date: Apr. 20, 2006

(65) Prior Publication Data
US 2008/0093977 A1  Apr. 24, 2008

(30) Foreign Application Priority Data

Oct. 12, 2004  (EP) .................................. 04104979

(51) Int. Cl.
*H05B 33/02* (2006.01)
*H01L 51/52* (2006.01)
(52) U.S. Cl.
USPC ............ 313/501; 313/502; 313/506; 428/690
(58) Field of Classification Search
USPC ............................ 313/501, 502, 506; 428/690
See application file for complete search history.

(56) References Cited

U.S. PATENT DOCUMENTS

| 5,405,710 | A |   | 4/1995  | Dodabalapur et al. |         |
|-----------|---|---|---------|--------------------|---------|
| 5,478,658 | A | * | 12/1995 | Dodabalapur et al. | 428/690 |
| 5,559,400 | A | * | 9/1996  | Nakayama et al.    | 313/506 |
| 5,939,142 | A | * | 8/1999  | Comiskey et al.    | 427/256 |
| 6,447,934 | B1|   | 9/2002  | Suzuki et al.      |         |
| 6,762,553 | B1| * | 7/2004  | Yokogawa et al.    | 313/509 |
| 6,815,092 | B2| * | 11/2004 | Van den Bergh et al. | 428/690 |

(Continued)

FOREIGN PATENT DOCUMENTS

| EP | 683623 | 11/1995 |
| WO | 2004021463 | 3/2004 |
| WO | 2004032576 | 4/2004 |
| WO | WO 2004089042 A1 * | 10/2004 |

OTHER PUBLICATIONS

Duggal et al., Organic light-emitting devices for illumination quality white light, Applied Physics Letters, May 13, 2002, pp. 3470-3472, vol. 80, No. 19.

*Primary Examiner* — Nimeshkumar Patel
*Assistant Examiner* — Steven Horikoshi

(57) ABSTRACT

An electroluminescent light source includes a layer structure comprising a first sublayer structure comprising at least one electrode as anode, one electrode as cathode and an electroluminescent layer located therebetween for emitting light, a second sublayer structure which adjoins the electrode provided for transmission, said second sublayer structure consisting of at least one semitransparent layer for partially reflecting the light, and a third sublayer structure which, as seen in the emission direction of the light, is arranged behind the second sublayer structure, said third sublayer structure comprising at least one layer having particles for absorbing some of the light at wavelengths below a threshold wavelength, for emitting light at wavelengths above the threshold wavelength, and for scattering the non-absorbed light.

16 Claims, 4 Drawing Sheets

U.S. PATENT DOCUMENTS

| | | |
|---|---|---|
| 2001/0033135 A1 | 10/2001 | Duggal et al. |
| 2002/0039002 A1* | 4/2002 | Fukasawa et al. ............ 313/512 |
| 2002/0063520 A1* | 5/2002 | Yu et al. ........................ 313/512 |
| 2002/0070681 A1* | 6/2002 | Shimizu et al. ............... 315/246 |
| 2002/0175619 A1 | 11/2002 | Kita et al. |
| 2003/0067578 A1* | 4/2003 | Lowe ............................ 349/164 |
| 2003/0111955 A1* | 6/2003 | McNulty et al. .............. 313/504 |
| 2003/0116719 A1* | 6/2003 | Miyazawa ................ 250/484.2 |
| 2003/0218420 A1* | 11/2003 | Zovko ........................... 313/506 |
| 2003/0227249 A1* | 12/2003 | Mueller et al. ................ 313/491 |
| 2004/0027062 A1 | 2/2004 | Shiang et al. |
| 2004/0046497 A1* | 3/2004 | Schaepkens et al. ......... 313/506 |
| 2004/0061107 A1 | 4/2004 | Duggal |
| 2004/0217693 A1* | 11/2004 | Duggal et al. ................ 313/504 |
| 2005/0007000 A1* | 1/2005 | Chou et al. .................... 313/116 |
| 2006/0049745 A1* | 3/2006 | Handa et al. .................. 313/503 |

* cited by examiner

ELECTROLUMINESCENT LIGHT SOURCE WITH IMPROVED COLOR RENDERING

The invention relates to electroluminescent light sources with a microcavity arrangement.

Light sources comprising electroluminescent thin layers (EL light sources) all have the problem that some of the light produced isotropically in the luminescent layer cannot be emitted towards the outside on account of total reflection at the interfaces from an optically denser medium (refractive index n1) to an optically thinner medium (refractive index n2<n1). By virtue of an optical resonator, a so-called microcavity arrangement, the percentage of light subjected to total reflection can be reduced and thus the efficiency of the light source can be increased. In this case, the microcavity arrangement consists of two mirrors, between which an electroluminescent layer (EL layer) is arranged for emitting light with a maximum intensity at a wavelength L. If the distance between the two mirrors (=microcavity length) corresponds approximately to the wavelength L of the emitted light, the light is no longer emitted isotropically but rather in the direction of the mirror preferably at angles of incidence smaller than the angle of total reflection.

Document U.S. Pat. No. 5,405,710 describes a microcavity arrangement for an electroluminescent light source for use in flat screens or LED printers. In this case, the layer arrangement is structured in such a way that spatially separate regions are provided for producing different colors, and in which the microcavity length is locally adapted to the respective wavelength. One serious disadvantage of these microcavity arrangements is the known angle-dependent intensity of the emission (Fabry-Perot effect).

Document EP 0683623 describes a microcavity arrangement for a non-structured, multicolor-emitting, organic electroluminescent layer for simultaneously increasing the efficiency of different wavelengths. In this case, the microcavity length does not correspond to an individual wavelength but rather to a compromise which has to be adapted very precisely to the wavelengths of the emitted radiation in order to be able to achieve an improvement in the lumen output. Since the microcavity length cannot be optimal for all emission wavelengths, the improvement obtained in the lumen output is smaller the greater the number of different wavelength ranges to be emitted. The disadvantage of the angle-dependent intensity of the emission is at least considerably reduced in document EP 0683623 by a scattering layer consisting of particles of foamed quartz glass embedded in a transparent substrate or consisting of a transparent substrate with a rough surface. In respect of the technical details regarding microcavity arrangements, reference should be made to document EP 0683623, which is hereby incorporated in this application. However, another serious disadvantage of a microcavity arrangement—the shift in the emission lines towards short wavelengths and the associated worsening of the color rendering—still exists in such a microcavity arrangement.

The conversion of light, that is to say the absorption of light of one wavelength and the subsequent re-emission of light with a longer wavelength, by means of particles forms part of the prior art; in fluorescent lamps, for example, particle layers are used to convert light from the ultraviolet spectral region into light in the visible spectral region.

It is therefore an object of the invention to provide an efficient electroluminescent light source with a microcavity arrangement for emitting white light with improved color rendering while at the same time avoiding the disadvantageous microcavity effects, said light source being cost-effective to produce.

This object is achieved by an electroluminescent light source comprising a layer structure applied to a substrate (1), said layer structure comprising (a) a first sublayer structure comprising at least one electrode as anode (3), one electrode as cathode (7) and an electroluminescent layer (5) located therebetween for emitting light, wherein one of the two electrodes is provided for reflecting the light and the respective other electrode is provided for transmitting the light, (b) a second sublayer structure (2) which adjoins the electrode provided for transmission, said second sublayer structure consisting of at least one semitransparent layer for partially reflecting the light, and (c) a third sublayer structure which, as seen in the emission direction of the light, is arranged behind the second sublayer structure, said third sublayer structure comprising at least one layer (9) having particles (10) for absorbing some of the light at wavelengths below a threshold wavelength, for emitting light at wavelengths above the threshold wavelength, and for scattering the non-absorbed light. The third sublayer structure combines in one layer the compensation of the angle-dependent intensity and color distribution of an EL light source with microcavity arrangement by means of a uniform distribution of the non-absorbed light by light scattering with an improvement in the emission properties such as color rendering, color point and brightness by absorbing some of the light and then re-emitting light at longer wavelengths which can be set by the choice of particle materials according to the desired properties.

In this case, the first and second sublayer structures together form the microcavity arrangement. Here, the electroluminescent layer may consist of an organic or inorganic material and be composed of one or more individual layers. The direction in which the microcavity arrangement emits the light is referred to as the emission direction of the light.

Hereinbelow, the wavelength at which 20% of the absorption strength in the absorption band used is reached will be referred to as the threshold wavelength for the absorption. The term "absorption band" is based on the energy band model for solids and refers to the energy band in which the electrons are excited by light absorption.

It is advantageous if the third sublayer structure, as seen in the emission direction of the light, is applied to the rear side of the substrate. In this case, the third sublayer structure does not have to be optically decoupled from the substrate in order to retain the positive effect of the microcavity arrangement, and this has advantages in terms of the production and stability of the third sublayer structure.

It is advantageous if the third sublayer structure, in particular the volume percent of the particles, the minimum diameter of the particles and the thickness of the third sublayer structure, is configured in such a way that the light exits the layer in a non-directional manner. Only in this way can the effect of angle-dependent emission in microcavity arrangements be effectively compensated.

To this end, it is advantageous if the volume percent of the particles of the third sublayer structure is between 5% and 60%, in order to ensure sufficient scattering.

It is furthermore advantageous if the particles in the third sublayer structure have a diameter greater than 0.5 µm. In the case of smaller particles, the ratio of absorption to backscattering is too unfavorable.

It is even more advantageous if the third sublayer structure is configured in such a way that the path length of the non-absorbed light on average corresponds to twice the layer thickness. A suitably long path length guarantees on average at least one occurring scattering event per light ray and thus sufficient scattering of the light in order to compensate for the angle-dependent emission in microcavity arrangements.

However, the layer thickness here is a function of the particle size and the volume fraction. The minimum layer thickness decreases for example as the volume fraction of the particles on the third sublayer structure increases, since the path length is extended on account of the increased scattering per layer volume.

It is moreover advantageous if the electroluminescent layer emits light with a respective maximum intensity at a first and/or second wavelength, wherein the first wavelength is shorter than the second wavelength. By way of example, the spectral components which are missing in order to produce white light can be added by suitable particle emission. In this respect, it is not necessary for the electroluminescent layer to emit in three or more spectral regions. The length of a multi-color microcavity arrangement can thus be selected in a more optimal manner in this case than in the case of an emitter which has more than two emission regions.

It is even more advantageous if the electroluminescent layer emits in the blue and red spectral regions. The microcavity effect of the shift in the emission wavelengths towards shorter-wave regions remains in the red spectral region on account of the lack of absorption in the third sublayer structure. In this way, the brightness (luminance) increases in accordance with the eye sensitivity curve. Emission in the blue spectral region allows light absorption in the shortest-wave visible spectral region, and this allows the production of any visible components of the spectrum by the particles.

Particularly advantageously, a threshold wavelength of the particles is shorter than the first wavelength, the shortest-wave emission of the electroluminescent layer, since the filtering-out of the short-wave spectral region by absorption and re-emission which can be set by the choice of material of the third sublayer structure leads to an improvement in the color rendering, in particular if the first wavelength lies in the blue spectral region.

It is even more advantageous if the third sublayer structure contains at least first particles and second particles which respectively emit at least in a first spectral region and in a second spectral region which is not the same as the first spectral region. By way of example, the production of white light can be achieved by absorption in the short-wave blue spectral region and re-emission in the yellow spectral region or in the green and red spectral region. By means of a suitable choice and mixing ratio of the first and second particles, the emission properties such as color rendering, color point and brightness can be adapted to the requirements of the electroluminescent light source.

The invention will be further described with reference to examples of embodiments shown in the drawings to which, however, the invention is not restricted.

Figure 1:
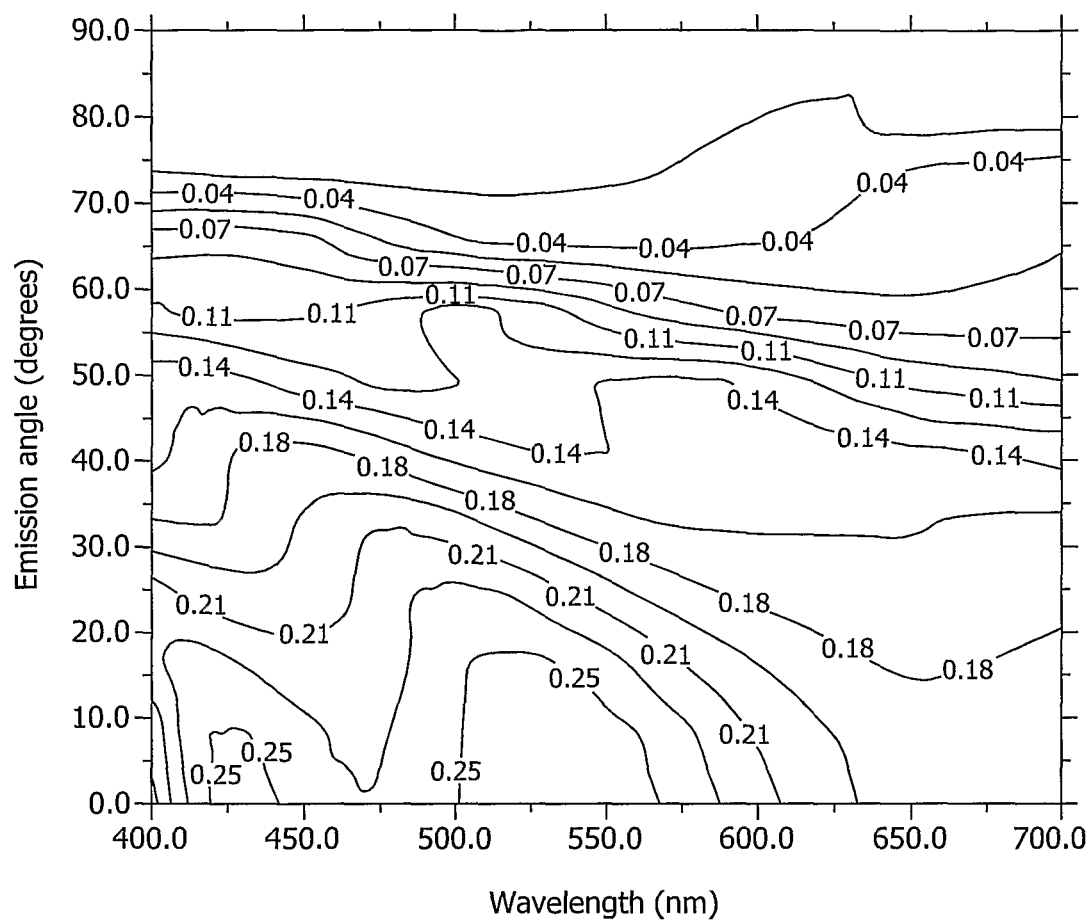
FIG. 1 shows the power, emitted into the glass substrate, of an electroluminescent light source without a microcavity arrangement, as a function of the wavelength and of the emission angle relative to the vertical on the glass substrate.

An electroluminescent light source usually consists of a layer structure applied to a flat transparent substrate 1 (glass or polymer), said layer structure consisting of an organic or inorganic electroluminescent layer 5 (EL layer) which is arranged between an anode 3 and a cathode 7. The EL layer may also be composed of a number of sublayers. An electron injection layer 6 made of a material with a low work function may additionally be arranged between the cathode and the EL layer. A hole transport layer 4 may additionally be arranged between the anode and the EL layer. Depending on the direction in which the emitted light is coupled out (bottom emitter: emission through the substrate, top emitter: emission away from the substrate, in this case through the cathode 7), either the cathode 7 or the anode 3 is made of a reflective material. The reflective electrode may either be reflective itself or else additionally have a reflective layer structure. Accordingly, the respective other electrode is made of a transparent material. The layers 3 to 7 are referred to in this document as the first sublayer structure.

FIG. 1 shows a typical emission characteristic of such an electroluminescent light source (bottom emitter) without a microcavity arrangement, as a function of the wavelength and the emission angle. The lines shown in each case represent lines of equal power. As can be seen in FIG. 1, a significant amount of power is emitted at an angle>41° (=angle of total reflection in glass) relative to the vertical of the glass substrate. This power cannot be coupled out of the EL light source on account of the total reflection which takes place.

Figure 2:
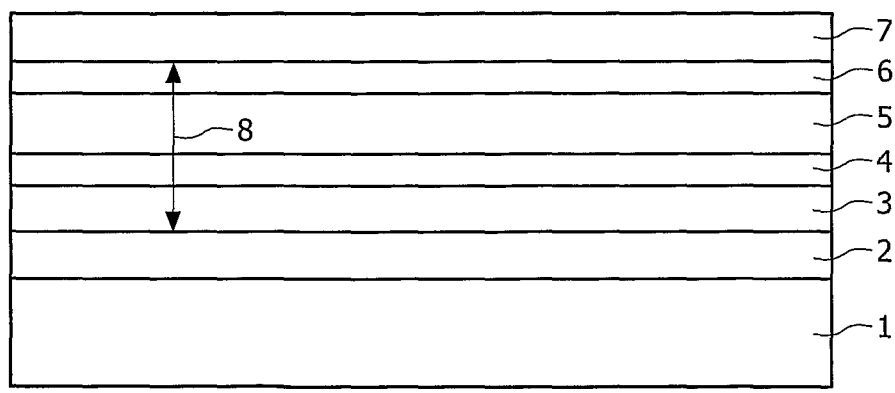
FIG. 2 shows the layer system of an electroluminescent light source with a microcavity arrangement.

FIG. 2 shows the layer structure of an EL light source with a microcavity arrangement. In such a light source, the electroluminescent layer 5 is arranged between a reflective electrode 7 (first mirror) and a partially reflective layer 2 (second mirror). A microcavity arrangement forms an optical resonator, as a result of which the light emitted by the electroluminescent layer is mainly emitted at small angles relative to the vertical of the substrate. In order to obtain a resonator which is as optimal as possible, the distance 8 between the first and second mirrors (microcavity length) corresponds to the wavelength of the maximum intensity of the light emitted by the EL layer. In the case of emission through the substrate, the semitransparent second mirror may be arranged between the transparent electrode and the EL layer or between the transparent electrode and the substrate (bottom emitter) or on the cathode (top emitter). The first and second mirrors may be composed of one layer or of a layer package with alternating refractive indices.

Figure 3:
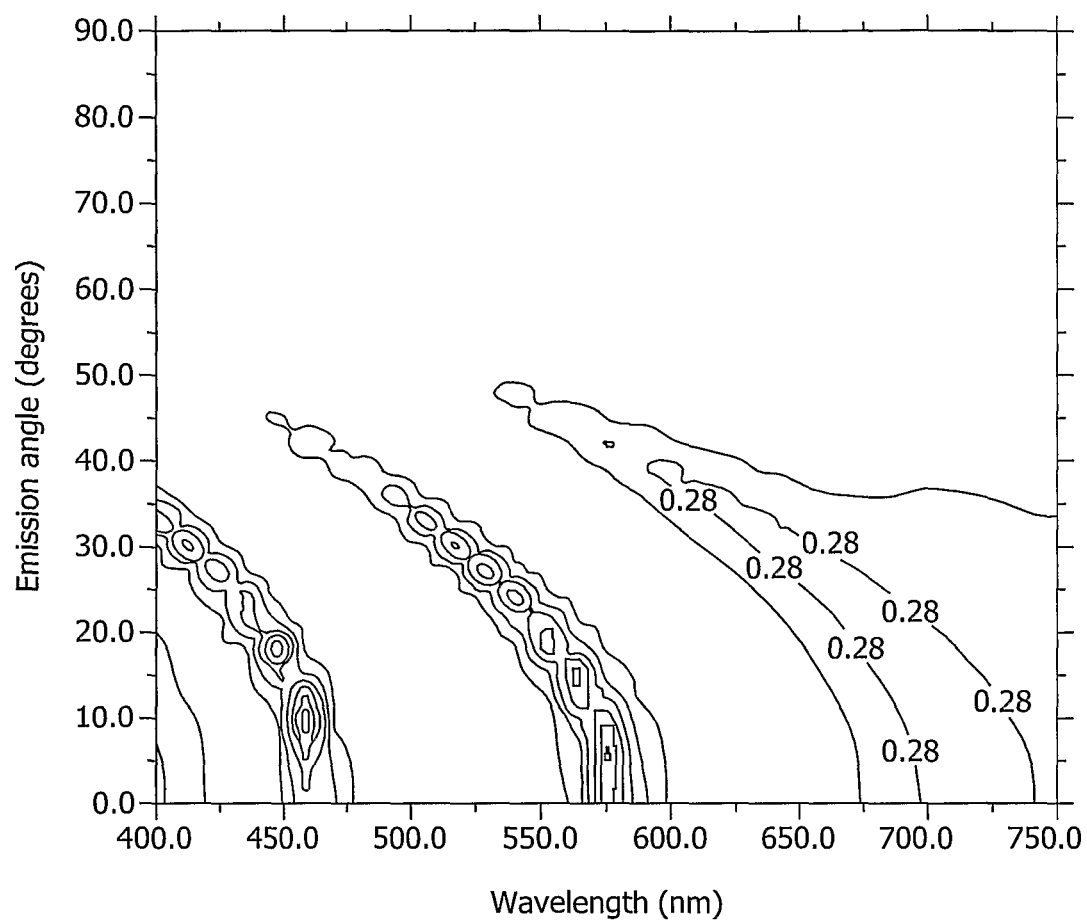
FIG. 3 shows the power, emitted into the glass substrate, as a function of the wavelength and of the emission angle relative to the vertical on the glass substrate, in respect of an electroluminescent light source with a microcavity arrangement.

FIG. 3 shows the emission characteristic of an EL light source (bottom emitter) with a microcavity arrangement. Here, the power emitted into the glass substrate is shown as a function of the wavelength and of the emission angle. The lines shown in each case represent lines of equal power. The light emitted by the EL layer is no longer emitted isotropically but rather is preferably emitted in the direction of the mirror. As can be seen from FIG. 3, almost no power is emitted at an angle>41° (=angle of total reflection in glass) relative to the vertical of the glass substrate. Although a microcavity has a very advantageous effect on the efficiency of the light source, FIG. 3 clearly shows the disadvantages of a microcavity arrangement, (a) the considerable angle-dependence of the intensity of the emission and (b) the shift in the intensity towards shorter wavelengths.

Although optical/passive scattering layers have a positive effect on the angle-dependence of the intensity of the emission of an EL light source with a microcavity arrangement, there is no change in the effect of the shift in the emission towards shorter wavelengths. Whereas such a shift in emission intensity is rather desirable in the red spectral region, the same effect in EL light sources for emitting white light leads to a worsening of the color rendering on account of the shift in wavelengths which likewise takes place in the blue spectral region. The desire for a shift in the intensity of emission in the red spectral range is given by the eye sensitivity curve (V($\lambda$) curve, cf. DIN 5031). Since the eye sensitivity considerably decreases above 600 nm towards long wavelengths, the brightness perceived by humans can be considerably improved by shifting the red emission characteristic towards shorter wavelengths without reducing the red color intensity of a light source. However, with the shift in wavelengths, only some of the power is shifted towards shorter wavelengths, as can be seen from FIG. 3.

Figure 4:
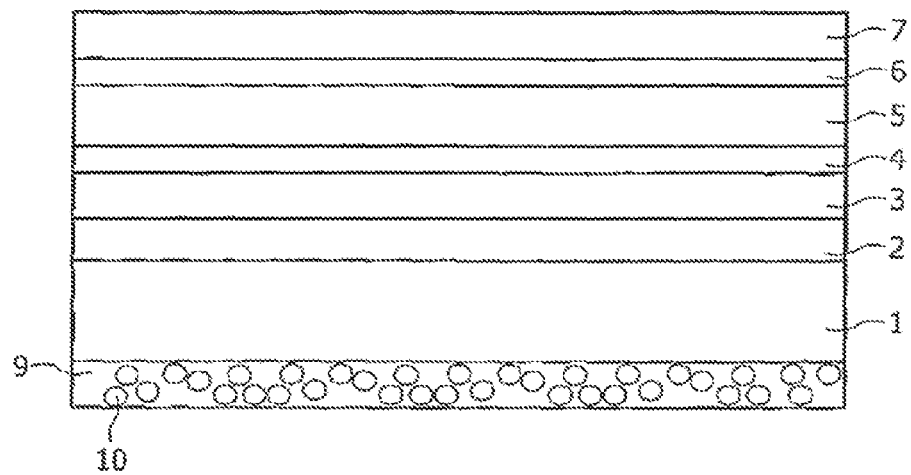
FIG. 4 shows a layer system according to the invention of an electroluminescent light source with a microcavity arrangement and a third sublayer structure.

FIG. 4 shows a layer structure according to the invention of an EL light source with a microcavity arrangement and with the third sublayer structure 9 according to the invention, which third sublayer structure, seen in the emission direction of the light, is applied to the rear side of the substrate. The third sublayer structure contains particles 10 for absorbing the emitted light at wavelengths above a threshold wavelength and for scattering the light below the threshold wavelength. In this case, the phosphorus particles 10 are embedded in a matrix made of passive carrier material (binder). The volume percent of particles on the layer is preferably between 5% and 30%. By virtue of this volume percent, sufficient absorption of the light is achieved while having a practical layer thickness. The particle diameter cannot be less than 500 nm, since otherwise the ratio between absorption and back-scattering becomes too unfavorable. The absorbed light is then emitted isotropically at a longer wavelength which depends on the type of particles 10 (emission process). The light which is subsequently emitted by the particle layer 9 is ideally distributed in a cosine manner (Lambert's). The preferred layer thickness of the third layer also depends on the scattering behavior of the individual particles 10 and on the volume fraction thereof and on the path length of the scattered light in the layer 9 which is thus determined. The path length of a scattered ray should on average correspond to at least twice the layer thickness in order that the microcavity effect of the angle-dependence of the emission is compensated. Typical thicknesses of such a third sublayer structure lie in the range of a few tens of µm. By virtue of this third sublayer structure, on the one hand the considerable angle-dependence of the intensity of the emission when using microcavity arrangements (cf. FIG. 3) is still prevented by scattering and isotropic re-emission. On the other hand, the emission spectrum (for example of a white EL light source) is additionally changed, by absorption of the shortest-wave component of the spectrum and re-emission of a desired longer wavelength, in such a way that the emission properties of the EL light source, such as color rendering, efficiency and/or the production conditions thereof, can additionally be improved/simplified.

Figure 6:
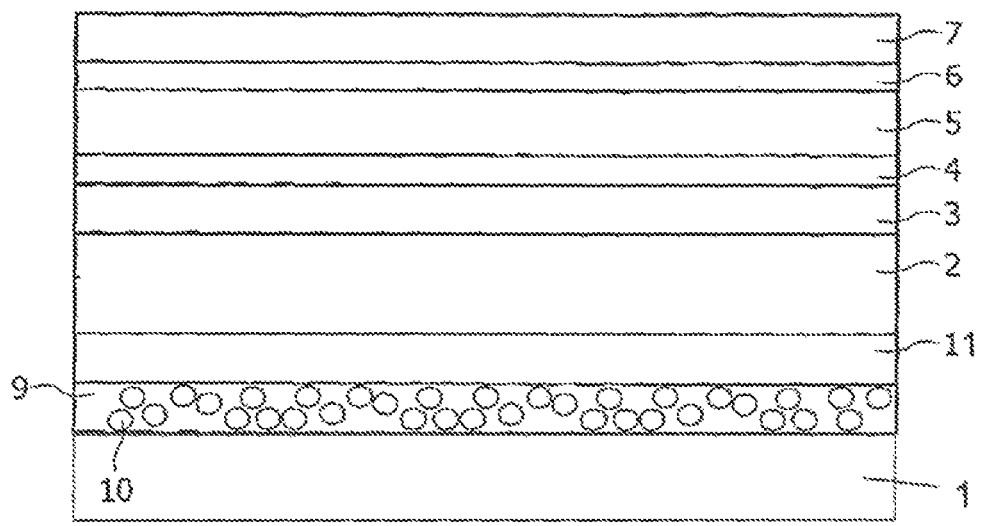
FIG. 6 shows a layer system according to another embodiment of the invention.

In another embodiment, the third sublayer structure may also be arranged between the substrate and the semitransparent second mirror 2, as shown in FIG. 6. In this case, the optical coupling of the third sublayer structure to the substrate can only be very low in order that the effect of the improved light emission by virtue of the microcavity arrangement is retained. A very low optical coupling is achieved by a porous particle layer without a carrier material which surrounds the particles, wherein in this case it is advantageous to additionally apply a smoothing and adhesion-promoting intermediate layer 11 between third scattering layer and electrode. The volume percent of the particles in such porous layers may be up to 60%.

In one preferred embodiment, an efficient homogeneous white EL light source can be produced by means of an EL layer 5 which emits in the blue spectral region. The improved lumen output is achieved by a light emission which is optimized by a microcavity arrangement. The microcavity length 8 can be set in an optimal manner for an EL layer 5 with just one emission wavelength. The light losses due to total reflections are thus minimized for such an EL light source. At the same time, the disruptive angle-dependence of the emission is avoided by the scattering of the non-absorbed fraction of the light at the particles 10. The light which is missing in order to produce homogeneous white light is produced by absorption of the short-wave component of the emitted blue light and subsequent isotropic re-emission in the yellow spectral region.

In a further preferred embodiment, the third sublayer structure may additionally have a second class of particles with the same absorption wavelength but different re-emission wavelength, in order to further improve the color rendering. Given the same particle size and distribution, the scattering properties remain unaffected thereby. White light can be produced for example with a blue emission of the EL layer and first and second particles with emissions in the green and red spectral region.

Figure 5:
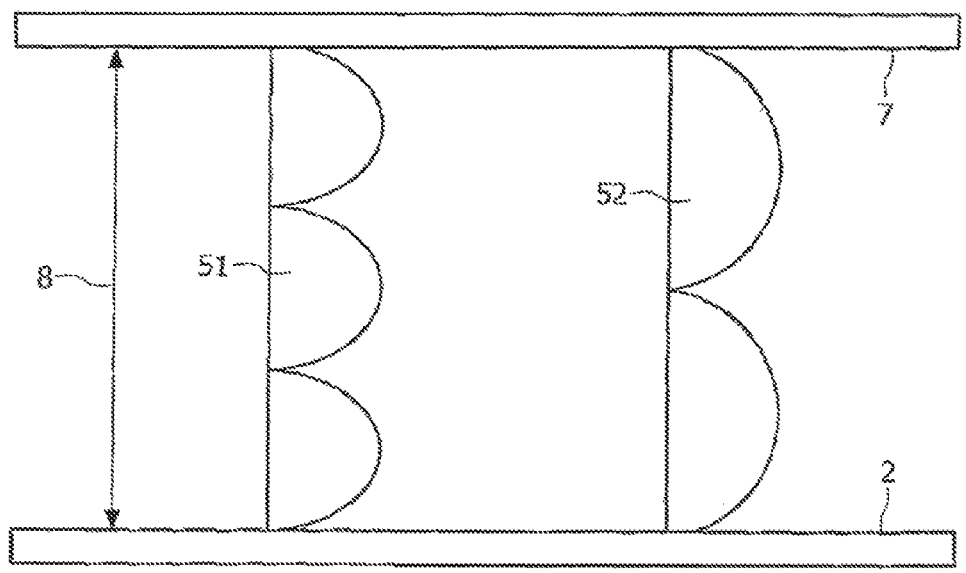
FIG. 5 shows a schematic diagram of a microcavity with two modes of a standing wave.

In another preferred embodiment, a multicolor microcavity arrangement according to document EP 0683623 can according to the invention be produced for providing an efficient white EL light source with improved color rendering and improved efficiency, by means of an EL light source which emits in the blue or in the blue and red spectral region (for example with an appropriately doped organic EL layer), cf. FIG. 5. The color rendering and color point can be appropriately set by suitably selecting the particles 10. By virtue of the reduction in the number of emitted spectral regions which is made possible by the particles, the microcavity length 8 has to be optimized in a simultaneous manner for just one or two wavelengths (modes of standing waves 51 and 52 for example for the blue and red spectral regions). This leads to a better compromise in terms of the microcavity length 8 than in the case of three different wavelengths for example, and thus to an increased light emission by means of a better microcavity effect.

In order to produce the electrode materials, the second layer structure and inorganic EL layers, use is usually made of vacuum methods such as coating, sputtering and/or chemical methods such as CVD (Chemical Vapor Deposition). For organic EL layers, use is made of coating or wet-chemical methods such as spraying the structure to be coated with liquid organic solutions and then baking out the solvent. In the case of distribution of the material by rotation of the substrate, the term spin-coating is used.

The third sublayer structure 9 is usually applied with a binder which fully or partially fills the spaces between the particles 10. By way of example, acrylates, polysiloxanes, silicones or sol-gel materials may be used as binder. It is advantageous if the refractive index of the binder is greater than or equal to the refractive index of the substrate. The suspension of particles 10 and binder material can be applied by various methods such as printing, spraying, knife-coating or spin-coating. Depending on the deposition method, a suspension having the required properties is produced. By way of example, in respect of a screen printing paste, 12 g of particle powder are mixed into a paste consisting of 100 g of terpineol with 5% by weight of ethylcellulose N100 with 2.6 g of Modaflow thixotropic agent. The particle powder may consist of first particles or of a mixture of first, second and possibly further particles.

1st example of embodiment: Blue-emitting organic electroluminescent light source with YAG:Ce particles in the third sublayer structure

| Layer thickness | Material |
|---|---|
| 100 nm | Reflective aluminum cathode |
| LiF electron injection layer | |
| Electron transport layer consisting of 8-hydroxyquinoline (Alq) | |
| Emission layer consisting of Alq, e.g. doped with pyrylene (blue) | |
| Hole transport layer consisting of amines, e.g. TPD | |
| 120 nm | Transparent anode consisting of ITO |
| 143 nm | $SiO_2$ |
| 46 nm | $TiO_2$ |
| 384 nm | $SiO_2$ |
| 137 nm | $TiO_2$ |
| Glass substrate | |

30 μm YAG: Ce particle layer, mean particle diameter 5 μm

White light is produced by mixing of blue-emitted light and absorption of the short-wave component of the blue light and re-emission in the yellow spectral region. In order to further improve the emission properties, the particle layer may also contain 20% particles of CaS:Eu in addition to YAG:Ce particles. YAG:Ce absorbs in the blue region at 460 nm, and CaS:Eu absorbs below approx. 580 nm. The $SiO_2$/$TiO_2$ layer structure forms the second mirror of the microcavity arrangement and is referred to as the second sublayer structure in this document.

2nd example of embodiment: Blue-emitting organic electroluminescent light source with CaS:Eu/$SrGa_2S_4$:Eu particles in the third sublayer structure

| Layer thickness | Material |
|---|---|
| 100 nm | Reflective aluminum cathode |
| LiF electron injection layer | |
| Electron transport layer consisting of 8-hydroxyquinoline (Alq) | |
| Emission layer consisting of Alq, e.g. doped with pyrylene (blue) | |
| Hole transport layer consisting of amines, e.g. TPD | |
| 120 nm | Transparent anode consisting of ITO |
| 143 nm | $SiO_2$ |
| 46 nm | $TiO_2$ |
| 384 nm | $SiO_2$ |
| 137 nm | $TiO_2$ |
| Glass substrate | |

20 μm CaS: Eu/$SrGa_2S_4$: Eu particle layer, mean particle diameter 5 μm

White light is produced by mixing of blue-emitted light and absorption of the short-wave component of the blue light and re-emission in the green ($SrGa_2S_4$:Eu) and red (CaS:Eu) spectral region. As an alternative to the above particle materials, $BaMg_2Al_{16}O_{27}$:Eu,Mn (green emission) and $Mg_4GeO_{5.5}F$:Mn (red emission) with absorption threshold wavelengths ≦430 nm would also be possible. The particle layer thickness and the mixture of red- and green-emitting particles are to be set such that, together with the emitted light of the organic EL layer, it sets the desired white color point. The $SiO_2$/$TiO_2$ layer structure forms the second mirror of the microcavity arrangement and is referred to as the second sublayer structure in this document.

3rd example of embodiment: Blue- and red-emitting organic electroluminescent light source with $SrGa_2S_4$:Eu particles in the third sublayer structure

| Layer thickness | Material |
|---|---|
| 100 nm | Reflective aluminum cathode |
| LiF electron injection layer | |
| Electron transport layer consisting of 8-hydroxyquinoline (Alq) | |
| Emission layer consisting of Alq, e.g. doped with pyrylene (blue) and DCM (red) | |
| Hole transport layer consisting of amines, e.g. TPD | |
| 120 nm | Transparent anode consisting of ITO |
| 143 nm | $SiO_2$ |
| 46 nm | $TiO_2$ |
| 384 nm | $SiO_2$ |
| 137 nm | $TiO_2$ |
| Glass substrate | |

20 μm $SrGa_2S_4$: Eu particle layer, mean particle diameter 5 μm

White light is produced by mixing of blue- and red-emitted light and absorption of blue light and re-emission in the green ($SrGa_2S_4$:Eu) spectral region. As an alternative to $SrGa_2S_4$:Eu, the use of particles of $BaMg_2Al_{16}O_{27}$:Eu,Mn (green emission) with absorption threshold wavelengths ≦430 nm would also be possible. The $SiO_2$/$TiO_2$ layer structure forms the second mirror of the microcavity arrangement and is referred to as the second sublayer structure in this document.

Further advantageous materials for absorbing light at wavelengths shorter than 430 nm and re-emitting light are ZnS:Ag (blue emission) or $SrAl_2O_4$:Eu (green emission). If necessary, a material which emits in the longer-wave blue spectral region may also be added to the third sublayer structure, in order to amplify the blue spectral component in the case of high absorption.

The embodiments explained with reference to the figures and the description are only examples of an electroluminescent light source and should not be understood as limiting the patent claims to these examples. Alternative embodiments which are likewise covered by the protective scope of the following patent claims will also be possible for the person skilled in the art. The numbering of the dependent claims is not intended to imply that other combinations of the claims do not also represent advantageous embodiments.

The invention claimed is:

1. An electroluminescent light source comprising a layer structure applied to a substrate, said layer structure comprising:
   a first sublayer structure comprising at least one electrode as anode, one electrode as cathode and an electroluminescent layer located therebetween for emitting light, wherein one of the electrodes is provided for reflecting the light and the other electrode is provided for transmitting the light,
   a second sublayer structure which adjoins the electrode provided for transmitting the light, said second sublayer structure comprising at least one semitransparent layer for partially reflecting the light, and
   a third sublayer structure which, as seen in the emission direction of the light, is arranged behind the second sublayer structure, said third sublayer structure comprising particles for absorbing some of the light at wavelengths below a threshold wavelength, for emitting light at wavelengths above the threshold wavelength, and for scattering the non-absorbed light,
   wherein a volume percent of the particles scattering the non-absorbed light of the third sublayer structure is greater than 50% and less than 60%,
   wherein the particles have a diameter greater than 0.5 μm, and the third sublayer structure is configured such that a path length of the light scattered in the third sublayer structure on average corresponds to twice a thickness of the third sublayer structure, wherein the path length is measured from a point when the light enters the third sublayer structure to a point when the light exits the third sublayer structure.

2. The electroluminescent light source as claimed in claim 1, wherein the third sublayer structure, as seen in the emission direction of the light, is applied to the rear side of the substrate.

3. The electroluminescent light source as claimed claim 1, wherein the electroluminescent layer emits light with a respective maximum intensity at a first and a second wavelength, wherein the first wavelength is shorter than the second wavelength.

4. The electroluminescent light source claimed in claim 3, wherein the first wavelength lies in the blue spectral region and the second wavelength lies in the red spectral region.

5. The electroluminescent light source a claimed in claim 3, wherein the threshold wavelength is shorter than the first wavelength.

6. The electroluminescent light source as claimed in claim 1, wherein the third sublayer structure includes at least first particles and second particles which respectively emit at least in a first spectral region and in a second spectral region different from the first spectral region.

7. The electroluminescent light source as claimed in claim 6, wherein the first spectral region is a yellow or green spectral region.

8. The electroluminescent light source as claimed in claim 6, wherein the second spectral region is a red spectral region.

9. The electroluminescent light source as claimed in claim 1, wherein the light is emitted from the light source isotropically.

10. The electroluminescent light source as claimed in claim 1, wherein the light traveled in the third sublayer structure is scattered such that a microcavity effect of an angle-dependence of the emission of the light is compensated.

11. The electroluminescent light source of claim 1, wherein the third sublayer structure comprises a binder which fully or partially fills spaces between the particles, and wherein a refractive index of the binder is greater than or equal to a refractive index of the substrate.

12. The electroluminescent light source of claim 11, wherein the binder comprises acrylates, polysiloxanes, silicones or sol-gel materials.

13. The electroluminescent light source of claim 1, wherein a microcavity length between the cathode and the at least one semitransparent layer of the second sublayer structure is optimized in a simultaneous manner for two wavelengths.

14. The electroluminescent light source of claim 13, wherein the two wavelengths comprise blue and red spectral regions.

15. An electroluminescent light source comprising a layer structure applied to a substrate, said layer structure comprising:
a first sublayer structure comprising two electrodes and an electroluminescent layer located between the two electrodes for emitting light, wherein a first electrode is provided for reflecting the light and a second electrode is provided for transmitting the light;
a second sublayer structure which adjoins the second electrode, said second sublayer structure comprising at least one semitransparent layer for partially reflecting the light;
a third sublayer structure which is arranged between the substrate and the second sublayer structure, said third sublayer structure comprising particles for absorbing some of the light at wavelengths below a threshold wavelength, for emitting light at wavelengths above the threshold wavelength, and for scattering the non-absorbed light, wherein the third sublayer structure comprises porous particles for reduced optical coupling, and wherein a volume percent of porous particles in the particle layer is greater than 50% and less than 60%; and
a smoothing layer between the third sublayer structure and second electrode,
wherein the electroluminescent layer emits light with a respective maximum intensity at a first and a second wavelength,
wherein the first wavelength lies in the blue spectral region and the second wavelength lies in the red spectral region,
wherein the threshold wavelength is shorter than the first wavelength, and
wherein the particles have a diameter greater than 0.5 μm, and the third sublayer structure is configured such that a path length of the light scattered in the third sublayer structure on average corresponds to twice a thickness of the third sublayer structure, wherein the path length is measured from a point when the light enters the third sublayer structure to a point when the light exits the third sublayer structure.

16. The electroluminescent light source of claim 15, wherein the third sublayer structure comprises the porous particles without a carrier material that surrounds the porous particles.

* * * * *